US012670750B2

(12) United States Patent
Sun

(10) Patent No.: US 12,670,750 B2
(45) Date of Patent: Jun. 30, 2026

(54) DRIVING ASSEMBLY MANAGEMENT SYSTEM, FAULT DETECTION METHOD, AND ELECTRIC POWER-ASSISTED BICYCLE

(71) Applicant: NANJING DMHC SCIENCE & TECHNOLOGY CO., LTD., Jiangsu (CN)

(72) Inventor: Min Sun, Jiangsu (CN)

(73) Assignee: NANJING DMHC SCIENCE & TECHNOLOGY CO., LTD., Jiangsu (CN)

(*) Notice: Subject to any disclaimer, the term of this patent is extended or adjusted under 35 U.S.C. 154(b) by 145 days.

(21) Appl. No.: 18/705,518

(22) PCT Filed: Sep. 21, 2022

(86) PCT No.: PCT/CN2022/120344
§ 371 (c)(1),
(2) Date: Apr. 26, 2024

(87) PCT Pub. No.: WO2023/071638
PCT Pub. Date: May 4, 2023

(65) Prior Publication Data
US 2025/0022322 A1      Jan. 16, 2025

(30) Foreign Application Priority Data

Oct. 28, 2021      (CN) .......................... 202111262287.1

(51) Int. Cl.
*G07C 5/00* (2006.01)
*B62M 6/45* (2010.01)
(Continued)

(52) U.S. Cl.
CPC ............... *G07C 5/008* (2013.01); *B62M 6/45* (2013.01); *G01M 17/007* (2013.01); *G01R 31/006* (2013.01); *H02K 11/35* (2016.01)

(58) Field of Classification Search
CPC ........ G07C 5/008; G07C 5/0808; B62M 6/45; B62M 6/80; G01M 17/007; G01R 31/006; H02K 11/35
(Continued)

(56) References Cited

U.S. PATENT DOCUMENTS 11,254,386 B2 * 2/2022 Isenschmid .............. B62J 45/20
11,538,289 B2 * 12/2022 Kim ..................... G07C 5/0808
(Continued)

FOREIGN PATENT DOCUMENTS

CN      105730274 A      7/2016
CN      108189956 A      6/2018
(Continued)

OTHER PUBLICATIONS

International Search Report, Translation and Written Opinion with regard to PCT/CN2022/120344 mailed Dec. 27, 2022.

*Primary Examiner* — Tuan C To
*Assistant Examiner* — Dominick Mulder
(74) *Attorney, Agent, or Firm* — BCF LLP

(57)      ABSTRACT

A driving assembly management system, a fault detection method, and an electric power-assisted bicycle. The driving assembly management system comprises: an Internet-of-things device, multiple digital assemblies, and a bus; each digital assembly comprises: a driving assembly and a digital circuit connected to the driving assembly; the digital circuit comprises: an assembly signal processing circuit, a first processor, and a first memory; an input end of the assembly signal processing circuit is connected to a signal acquisition end of the driving assembly; the first processor is further (Continued)

connected to the assembly signal processing circuit; the first memory is connected to the first processor; and the Internet-of-things device is communicatively connected to the first processor in the multiple digital assemblies, so as to perform fault detection according to working state data and identification information of the multiple digital assemblies.

20 Claims, 3 Drawing Sheets

(51) Int. Cl.
| | | |
|---|---|---|
| *G01M 17/007* | (2006.01) | |
| *G01R 31/00* | (2006.01) | |
| *H02K 11/35* | (2016.01) | |

(58) Field of Classification Search
USPC ........................................................ 701/31.4
See application file for complete search history.

(56) References Cited

U.S. PATENT DOCUMENTS

| | | | | |
|---|---|---|---|---|
| 11,704,067 B2 * | 7/2023 | Hung | ......................... | G06T 1/60 |
| | | | | 711/165 |
| 2003/0179004 A1 | 9/2003 | Fukusumi et al. | | |
| 2013/0201316 A1 * | 8/2013 | Binder | ..................... | G07C 3/02 |
| | | | | 701/2 |
| 2014/0209400 A1 * | 7/2014 | Yao | .......................... | B62M 6/45 |
| | | | | 180/167 |
| 2016/0221445 A1 * | 8/2016 | Tanaka | ....................... | B60L 3/10 |
| 2019/0300104 A1 * | 10/2019 | Saruwatari | ............... | B62M 6/45 |
| 2019/0385386 A1 * | 12/2019 | Davidson | ............. | G07C 5/0858 |
| 2020/0124430 A1 * | 4/2020 | Bradlow | ................ | B62J 45/412 |
| 2020/0177266 A1 * | 6/2020 | Kang | .................... | H04L 5/0092 |
| 2020/0262510 A1 * | 8/2020 | Hahn | ........................ | B62M 6/50 |
| 2021/0135713 A1 * | 5/2021 | Kang | ................. | H04W 72/046 |
| 2022/0194511 A1 * | 6/2022 | French | ..................... | B62J 45/20 |
| 2022/0204110 A1 * | 6/2022 | Silsby | ..................... | B62M 6/45 |
| 2024/0083283 A1 * | 3/2024 | Itakura | ..................... | B60L 3/12 |

FOREIGN PATENT DOCUMENTS

| | | |
|---|---|---|
| CN | 112379208 A | 2/2021 |
| CN | 112591003 A | 4/2021 |
| CN | 114013554 A | 2/2022 |
| JP | 01140834 A | 6/1989 |

* cited by examiner

Internet-of-things device 100

300

Driving assembly 201

Assembly signal processing circuit 203

First processor 204

First memory 205

202    200

Digital assembly 200

Internet-of-things device 100

300

Motor driving circuit 401

Second processor 402

Second memory 403

400

Motor    Digital circuit 202    200

Digital assembly 200

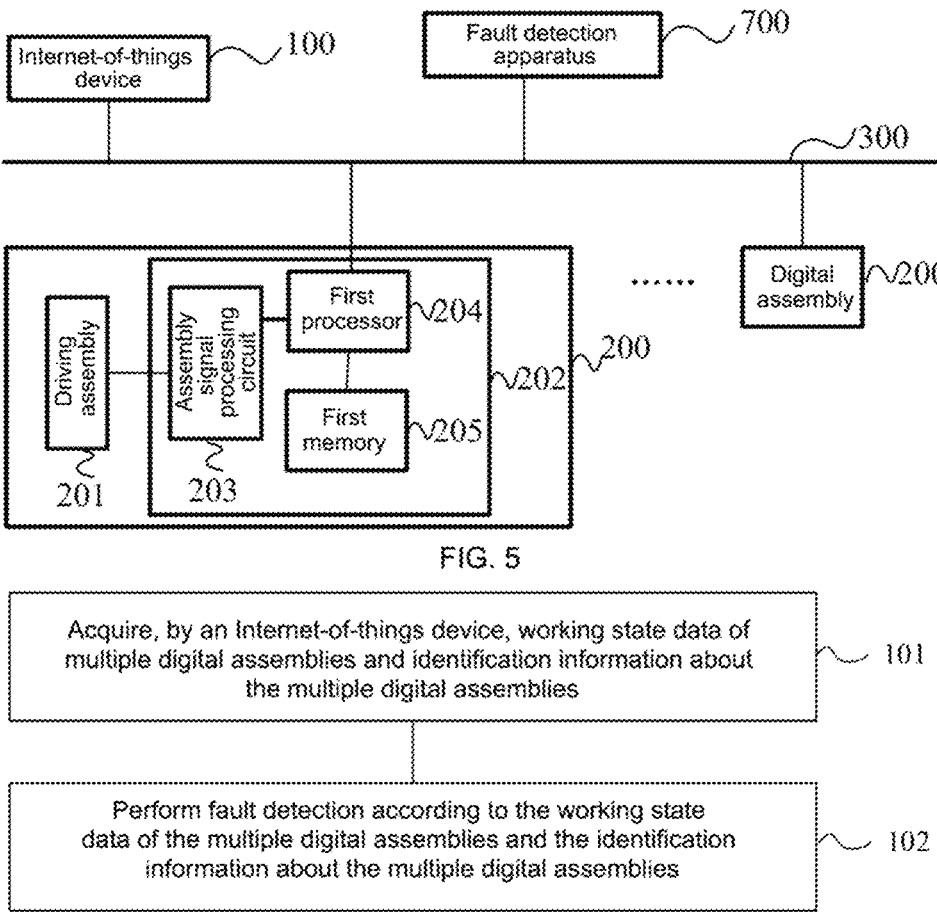
FIG. 5
Acquire, by an Internet-of-things device, working state data of multiple digital assemblies and identification information about the multiple digital assemblies ～ 101
Perform fault detection according to the working state data of the multiple digital assemblies and the identification information about the multiple digital assemblies ～ 102
FIG. 6
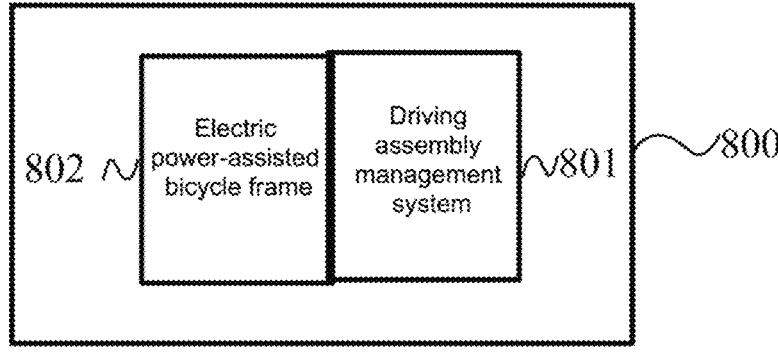
FIG. 7

DRIVING ASSEMBLY MANAGEMENT SYSTEM, FAULT DETECTION METHOD, AND ELECTRIC POWER-ASSISTED BICYCLE

CROSS REFERENCE TO RELATED APPLICATION

The present disclosure claims the priority to the Chinese patent application No. 202111262287.1 filed with the China National Intellectual Property Administration on Oct. 28, 2021, and entitled "DRIVING ASSEMBLY MANAGEMENT SYSTEM, FAULT DETECTION METHOD AND ELECTRIC POWER-ASSISTED BICYCLE", the contents of which are incorporated herein by reference in entirety.

TECHNICAL FIELD

The present disclosure relates to technical field of assembly management, and specifically to a driving assembly management system, a fault detection method and an electric power-assisted bicycle.

BACKGROUND ART

With rapid development of science, technology and economy, electric power-assisted bicycles have gone deep into people's lives, and technical requirements for the electric power-assisted bicycles are also increasingly higher.

Compared with traditional bicycles, the electric power-assisted bicycles can provide, on the basis of having the basic riding function, power assistance during users' riding, so as to reduce riding power of the users. To assist power, the electric power-assisted bicycles need to have a driving system. A driving assembly in the driving system of the traditional electric power-assisted bicycles usually is unable to process information, and an operating state of the driving assembly cannot be automatically acquired. Therefore, if fault detection needs to be performed on a traditional electric power-assisted bicycle, the driving system of the electric power-assisted bicycle needs to be disassembled first, and after that, it is subjectively judged whether each driving assembly has a fault by person.

Therefore, as the driving assembly of the traditional electric power-assisted bicycles is not intelligent enough, this causes difficulties for fault detection of the driving assembly in the driving system, thereby making it difficult to maintain the driving system of the electric power-assisted bicycles.

SUMMARY

Regarding the above shortcomings in the prior art, the present disclosure aims at providing a driving assembly management system, a fault detection method and an electric power-assisted bicycle, so as to solve the problems in the prior art, for example, the driving assembly of the electric power-assisted bicycles is not intelligent enough, and thus it is difficult to detect faults of the driving assembly.

In order to achieve the above objective, technical solutions adopted in the embodiments of the present disclosure are as follows.

In the first aspect, embodiments of the present disclosure provide a driving assembly management system, wherein the driving assembly management system includes: an Internet-of-things device, multiple digital assemblies and a bus; each digital assembly includes: one driving assembly in a driving system of an electric power-assisted bicycle, and a digital circuit connected to the driving assembly, and wherein the digital circuit includes: an assembly signal processing circuit, a first processor and a first memory, where an input end of the assembly signal processing circuit is connected to a signal collection end of the driving assembly, so as to process a driving signal of the driving assembly during working, and obtain working state data of the digital assembly, the first processor is further connected to the assembly signal processing circuit, so as to acquire the working state data of the digital assembly; and the first memory is connected to the first processor, so as to store the working state data and identification information about the digital assembly; and the Internet-of-things device is connected in communication with the first processors in the multiple digital assemblies through the bus, so as to perform fault detection according to the working state data of the multiple digital assemblies and the identification information about the multiple digital assemblies.

Optionally, the multiple digital assemblies include: a motor digital assembly, and a driving assembly in the motor digital assembly is a motor, wherein the driving assembly management system further includes: a controller, wherein the controller includes: a motor driving circuit and a second processor; and the second processor is mounted on the bus, so that the second processor acquires the working state data of the multiple digital assemblies;

the second processor is further connected to the motor driving circuit, so that the second processor outputs a pulse control signal to the motor driving circuit based on the working state data of the multiple digital assemblies; and the motor driving circuit is connected to a three-phase input end of the motor, so that a three-phase control signal output by the motor driving circuit drives the motor to output power assistance.

Optionally, the controller further includes: a second memory, wherein the second memory is connected to the second processor, so as to store identification information about the controller, and working state data of the controller.

Optionally, the Internet-of-things device is connected in communication with a cloud server, so that the cloud server performs fault detection on the electric power-assisted bicycle based on the working state data of the multiple digital assemblies.

Optionally, the driving assembly management system further includes: a fault detection apparatus, wherein the fault detection apparatus is mounted on the bus, so as to perform fault detection on the electric power-assisted bicycle based on the working state data of the multiple digital assemblies.

Optionally, the multiple digital assemblies further include: at least one digital assembly of a battery management digital assembly, a meter digital assembly, and a sensor digital assembly.

In the second aspect, embodiments of the present disclosure provide a fault detection method for a driving assembly, wherein this method is applied to the driving assembly management system according to any one of the above first aspect, and the method includes steps of:

acquiring, by the Internet-of-things device, working state data of the multiple digital assemblies and identification information about the multiple digital assemblies; and performing fault detection according to the working state data of the multiple digital assemblies and the identification information about the multiple digital assemblies.

Optionally, the step of performing fault detection according to the working state data of the multiple digital assemblies and the identification information about the multiple digital assemblies includes:

transmitting, through the Internet-of-things device, the working state data of the multiple digital assemblies and the identification information about the multiple digital assemblies to a cloud server, so that the cloud server performs fault detection according to the working state data of the multiple digital assemblies and the identification information about the multiple digital assemblies; or performing, by the Internet-of-things device, fault detection according to the working state data of the multiple digital assemblies and the identification information about the multiple digital assemblies; or transmitting, through the Internet-of-things device, the working state data of the multiple digital assemblies and the identification information about the multiple digital assemblies, to a fault detection apparatus connected to the Internet-of-things device through the bus, and performing, by the fault detection apparatus, fault detection according to the working state data of the multiple digital assemblies and the identification information about the multiple digital assemblies.

Optionally, the method further includes a step of:

generating, if a fault detection result indicates that at least one digital assembly among the multiple digital assemblies has a fault, demand order information for replacing the at least one digital assembly according to identification information about the at least one digital assembly that has a fault.

In the third aspect, embodiments of the present disclosure provide an electric power-assisted bicycle, wherein the electric power-assisted bicycle includes: an electric power-assisted bicycle frame; and the driving assembly management system according to any one of the above first aspect mounted on the electric power-assisted bicycle frame.

Compared with the prior art, the present disclosure has the following beneficial effects:

Embodiments of the present disclosure provide a driving assembly management system, a fault detection method and an electric power-assisted bicycle. As the driving assembly management system includes: the Internet-of-things device, multiple digital assemblies and the bus, each digital assembly includes: one driving assembly and the digital circuit connected to the driving assembly, and the digital circuit includes the assembly signal processing circuit, the first processor and the first memory, the input end of the assembly signal processing circuit is connected to the signal collection end of the driving assembly, so as to implement collection of the working state data of the driving assembly. The first processor is also connected to the assembly signal processing circuit, and the first memory is connected to the first processor, so as to realize storage of the working state data and identification information about the digital assembly. The Internet-of-things device is connected in communication with the first processors in the multiple digital assemblies through the bus, so that the fault detection may be performed according to the working state data of the multiple digital assemblies and the identification information about the multiple digital assemblies. In the solutions provided in the embodiments of the present disclosure, as the driving assembly management system of the electric power-assisted bicycle includes the Internet-of-things device, and each digital assembly connected to the Internet-of-things device through the bus further includes, in addition to the traditional driving assembly, the assembly signal processing circuit, corresponding processor and corresponding memory, collection of the working state data of the driving assembly and storage of the working state data and the identification information are realized by the digital assembly, and intellectualization of the digital assembly is realized, so that when detection and maintenance are performed on the driving assemblies, neither disassembly nor manual determination is needed, and automatic fault detection may be performed based on the working state data and the identification information, which effectively facilitates the maintenance of the driving system of the electric power-assisted bicycle.

BRIEF DESCRIPTION OF DRAWINGS

In order to more clearly illustrate technical solutions of embodiments of the present disclosure, drawings which need to be used in the embodiments will be introduced briefly below. It should be understood that the drawings merely show some embodiments of the present disclosure, and thus they should not be considered as limitation to the scope. Those ordinarily skilled in the art still could obtain other relevant drawings according to these drawings, without using any inventive efforts.

FIG. 5 is a structural schematic diagram of another driving assembly management system provided in embodiments of the present disclosure;

FIG. 6 is a schematic flowchart of a fault detection method for a driving assembly provided in embodiments of the present disclosure; and FIG. 7 is a structural schematic diagram of an electric power-assisted bicycle provided in embodiments of the present disclosure.

REFERENCE SIGNS

Figures 1, 2:
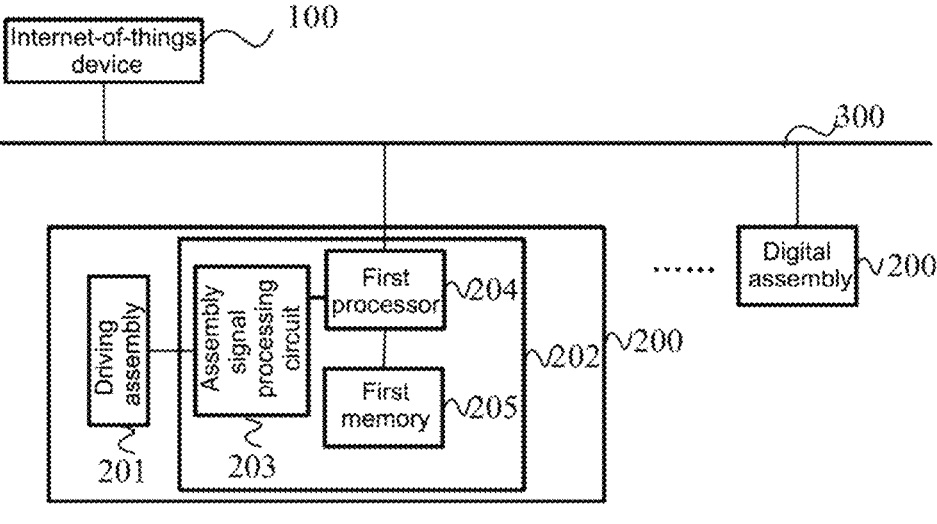
FIG. 1 is a structural schematic diagram of a driving assembly management system provided in embodiments of the present disclosure.
FIG. 2 is a structural schematic diagram of another driving assembly management system provided in embodiments of the present disclosure.

100—Internet-of-things device; 200—digital assembly; 201—driving assembly; 202—digital circuit; 203—assembly signal processing circuit; 204—first processor; 205—first memory; 300—bus; 400—controller; 401—motor driving circuit; 402—second processor; 403—second memory; 500—cloud server; 600—client; 700—fault detection apparatus; 800—electric power-assisted bicycle; 801—driving assembly management system; 802—electric power-assisted bicycle frame.

DETAILED DESCRIPTION OF EMBODIMENTS

In order to make the objectives, technical solutions and advantages of the embodiments of the present disclosure dearer, the technical solutions in the embodiments of the present disclosure will be described clearly and completely below in combination with the drawings in the embodiments of the present disclosure. Obviously, the embodiments described are some but not all embodiments of the present disclosure. Generally, components in the embodiments of the present disclosure, as described and shown in the drawings herein, may be arranged and designed in various different configurations.

Therefore, the detailed description below of the embodiments of the present disclosure provided in the drawings is not intended to limit the scope of the present disclosure claimed, but merely illustrates chosen embodiments of the present disclosure. All of other embodiments obtained by those ordinarily skilled in the art based on the embodiments in the present disclosure without using inventive efforts shall fall within the scope of protection of the present disclosure.

It should be noted that like reference signs and letters represent like items in the following drawings. Therefore, once a certain item is defined in one drawing, it is not needed to be further defined or explained in subsequent drawings.

In addition, the terms such as "first" and "second", if appearing, are only used for distinguishing description, and cannot be understood as indicating or implying importance in the relativity.

It should be noted that the features in the embodiments of the present disclosure may be combined with each other without conflict.

During use of an electric power-assisted bicycle, a driving assembly in a driving system of the electric power-assisted bicycle may have a fault, so that the electric power-assisted bicycle cannot accurately provide power assistance to a user. However, since various driving assemblies in a driving system of a traditional electric power-assisted bicycle only have corresponding basic functions, but do not have data collection and storage functions, they are not intelligent enough, so that the user cannot know which driving assembly has a fault, let alone knowing relevant information about the faulty driving assembly, which presents difficulties for subsequent repair and replacement services.

In order to facilitate maintenance of the electric power-assisted bicycles, the present disclosure provides a digital driving assembly management system that is more intelligent than the driving system of the traditional electric power-assisted bicycles. The driving assembly management system, that is, the digital driving assembly management system, of an electric power-assisted bicycle provided in embodiments of the present disclosure is explained and described in detail below with reference to multiple embodiments.

FIG. 1 is a structural schematic diagram of a driving assembly management system provided in embodiments of the present disclosure. As shown in FIG. 1, the driving assembly management system includes: an Internet-of-things device 100, multiple digital assemblies 200 and a bus 300, wherein the Internet-of-things device 100 is connected in communication with the multiple digital assemblies 200 through the bus 300.

In the above, each digital assembly 200 includes: one driving assembly 201 in a driving system of an electric power-assisted bicycle, and a digital circuit 202 connected to the driving assembly 201. The digital circuit 202 includes: an assembly signal processing circuit 203, a first processor 204 and a first memory 205. The first processor 204 may be, for example, an MCU (Microcontroller Unit).

An input end of the assembly signal processing circuit 203 is connected to a signal collection end of the driving assembly 201, so as to process a driving signal of the driving assembly 201 during working, and obtain working state data of the digital assembly 200. The assembly signal processing circuit 203 may, for example, perform current-limiting and denoising processing through the driving signal to obtain the working state data of the digital assembly 200. The first processor 204 is further connected to the assembly signal processing circuit 203, so as to acquire the working state data of the digital assembly 200. The assembly signal processing circuit 203 may be connected to an AD end (a port for inputting analog quantity) of the first processor 204. The first memory 205 is connected to the first processor 204, so as to store the working state data and identification information about the digital assembly 200. In the above, the working state data may be stored in the first memory 205 after being acquired by the first processor 204, and identification information about the digital assembly 200 is stored in advance in the first memory 205 before delivery. Exemplarily, the identification information about the digital assembly 200 may be a serial number of the driving assembly 201 in the digital assembly 200. The serial number of the driving assembly 201 may be identity of this driving assembly 201, so as to distinguish different driving assemblies 201. The serial number of the driving assembly 201 may include at least one kind of information such as manufacturer, product model, batch, date, and number. An assembly serial number may be uniformly set according to the same manufacturer and the same product model; and the assembly serial number also may be uniquely set according to manufacturer, product model, batch, date, unique number, and the like.

The Internet-of-things device 100 is connected in communication with first processors 204 in the multiple digital assemblies 200 through the bus 300, that is, the Internet-of-things device 100 and the multiple digital assemblies 200 are all connected to the bus 300. Exemplarily, the Internet-of-things device 100 and digital circuits 202 in the digital assemblies 200 each include a bus interface, wherein the Internet-of-things device 100 is connected to the bus through its own bus interface, and the digital assemblies 200 are connected to the bus through bus interfaces in corresponding digital circuits 202. The bus interfaces of the digital circuits 202 are connected to the first processors 204 in the digital circuits 202. The bus interfaces are interfaces matching the bus 300, and if the bus 300 is a CAN (Controller Area Network) bus, the bus interfaces are CAN bus interfaces.

Exemplarily, the Internet-of-things device 100 may be provided at a head of the electric power-assisted bicycle (located between two handlebars of the electric power-assisted bicycle). The Internet-of-things device 100 also may be an independent device, which is non-fixedly installed inside the electric power-assisted bicycle, but is connected to the driving system through a reserved interface of the bus 300 when driving assembly management is required. For example, when fault detection needs to be performed, the Internet-of-things device 100 is connected to the driving system through a reserved socket of the bus 300 of the electric power-assisted bicycle. The Internet-of-things device 100 may not be an independent device, while functions of the Internet-of-things device 100 are integrated into a control device of the electric power-assisted bicycle, realizing a corresponding connection relationship of the Internet-of-things device 100.

The first processor 204 in the digital circuit 202 in the digital assembly 200, in a case of obtaining the working state data, may encapsulate the working state data into a packet of bus protocol and transmit it to the bus 300 through a corresponding bus interface. If the bus 300 is a CAN bus, the bus protocol may be CAN bus protocol.

The Internet-of-things device 100 may acquire the working state data of the digital assemblies 200 transmitted by the first processors 204 in the multiple digital assemblies 200 and the identification information about the digital assemblies 200. After acquiring the working state data of the multiple digital assemblies 200 and the identification information about the multiple digital assemblies 200, the Internet-of-things device 100 may perform the fault detection by itself, or may send the working state data and the identification information to other devices, and the fault detection is performed by other devices.

The CAN protocol is explained by an example below: the CAN protocol supports broadcast communication and point-to-point communication. A point-to-point message belongs to a process communication message, and any nodes may send the message to each other. The CAN protocol currently supports 16 nodes. In CAN communication protocol, an available data frame structure is as shown in following Table 1:

example, the Internet-of-things device 100 also may send a data collection message to the digital assemblies 200 in the point-point manner through the bus 300, and upon receipt of the data collection message, the digital assemblies 200 transmit the working state data of and identification information about the digital assemblies 200 to the Internet-of-things device 100 in an idle time period.

The above Internet-of-things device 100 also may include a processor and a corresponding memory. In a case where the memory in the Internet-of-things device 100 may store the working state data of the multiple digital assemblies 200 and the identification information about the multiple digital assemblies 200 acquired by the Internet-of-things device 100, the working state data of the multiple digital assemblies 200 and the identification information about the multiple digital assemblies 200 are stored. Besides, the memory in the Internet-of-things device 100 also may store identification information about the Internet-of-things device 100, and corresponding working state data. Exemplarily, the processor in the Internet-of-things device 100 also may be, for example, an MCU. The processor in the Internet-of-things

TABLE 1

| Frame Structure | Start Field | Arbitration Field | Control Field | Data Field | CRC Field | ACK Field | End Field |
|---|---|---|---|---|---|---|---|
| Extended Frame | SOF 1 bit | ID 29 bit | IDE/RO 6 bit | 0-64 bit | 15 + 1 bit | 2 bit | 7 bit |

In the above, the start field, the CRC field, the ACK field and the end field may be automatically generated by hardware of processors in the digital assemblies and the Internet-of-things device, and contents of the arbitration field, the control field and the data field may be configured by software. The start field also may be called as a start of frame (SOF) domain, so as to indicate start of the data frame. The arbitration field carries identification (ID), and it is impossible for multiple devices to use the same ID at the same time to transmit data frames on the bus. In the arbitration field, by adding source node ID, target node ID, command, priority, data type and other information, different transmission data frames are distinguished.

The control field, which may be used to represent reserved bits and number of data bytes, occupies six bits, and indicates the number of data bytes of information to be transmitted. The data field carries data contents, wherein data of 0-8 bytes can be sent, that is, the amount of data transmitted in one frame is 0-8 bytes, and data with a length exceeding 8 BYTES need to be transmitted in multiple packets. The CRC field may be used to detect transmission errors of the frame. The ACK field is used to confirm that the frame has been normally received. The end field may be used to indicate end of the data frame.

In a possible application scenario, the Internet-of-things device 100 may acquire the working state data and the identification information in a broadcast manner. For example, the Internet-of-things device 100 may broadcast and send a data collection message to the digital assemblies 200 through the bus 300, and upon receipt of the broadcast data collection message, the digital assemblies 200 may transmit the working state data of and identification information about the digital assemblies 200 to the Internet-of-things device 100 in an idle time period.

In another possible application scenario, the Internet-of-things device 100 may acquire the working state data and the identification information in a point-to-point manner. For device 100 also may be connected to a network communication interface, and the Internet-of-things device 100 may be connected in communication with other external devices through the network communication interface. Other external devices may be, for example, cloud servers, or intelligent terminals connected to the Internet-of-things device 100.

To sum up, for the driving assembly management system provided in the present disclosure, as the driving assembly management system of the electric power-assisted bicycle includes the Internet-of-things device, and each digital assembly connected to the Internet-of-things device through the bus further includes, in addition to the traditional driving assembly, the assembly signal processing circuit, corresponding processor and corresponding memory, collection of the working state data of the driving assembly and storage of the working state data and the identification information are realized by the digital assembly, and intellectualization of the digital assembly is realized, so that when detection and maintenance are performed on the driving assemblies, neither disassembly nor manual determination is needed, that is, automatic fault detection may be performed based on the working state data and the identification information, which effectively facilitates the maintenance of the driving system of the electric power-assisted bicycle, and provides more convenient post-sales services for users.

On the basis of FIG. 1, embodiments of the present disclosure further provide another driving assembly management system. FIG. 2 is a structural schematic diagram of another driving assembly management system provided in embodiments of the present disclosure. As shown in FIG. 2, the multiple digital assemblies 200 include: a motor digital assembly.

In the above, the driving assembly 201 in the motor digital assembly is a motor. In order to implement driving control to the motor, the driving assembly management system further includes: a controller 400, and the controller 400 includes: a motor driving circuit 401 and a second processor 402. The second processor 402 is mounted on the bus 300, so that the second processor 402 acquires working state data of the multiple digital assemblies 200. The second processor 402 is further connected to the motor driving circuit 401, so that the second processor 402 outputs a pulse control signal to the motor driving circuit based on the working state data of the multiple digital assemblies 200. The motor driving circuit is connected to a three-phase input end of the motor, so that a three-phase control signal output by the motor driving circuit drives the motor to output power assistance. That is to say, the controller 400 may cooperate with the motor through the motor driving circuit 401 in the controller, so as to drive the motor to rotate. The controller 400, as a data information processing unit and a driving instruction execution unit, is a core of the whole driving system, and may provide power assistance by controlling the driving motor to rotate. Exemplarily, the motor may be, for example, a hub motor that is mounted in a hub of the bicycle, and the controller 400 may control the hub motor through the motor driving circuit 401 in the controller, so as to directly drive bicycle wheels to rotate. The motor also may be a mid-drive motor that is a motor mounted at a middle position (namely, a pedaling position) of a body of the electric power-assisted bicycle and is connected to the bicycle wheels through a chain. The controller 400 may control the mid-drive motor through the motor driving circuit 401 in the controller, driving the bicycle wheels to rotate. As in the above example, the second processor 402 in the controller 400 may be an MCU.

For the motor digital assembly, corresponding working state data thereof are: at least one kind of working state data such as Hall position signal, temperature signal, and rotation speed signal generated during working of the motor. The working state data may be used to determine whether the motor in the motor digital assembly has a fault. As shown in following Table 2, temperature signal variation amplitude in the working state data may be used to determine whether a motor temperature sensor has a fault (for example, when the motor rotates, an output temperature signal has no change, or an output temperature signal rises too fast), the temperature signal in the working state data may be used to determine whether a temperature of the motor reaches a protection point, and the Hall position signal in the working state data may be used to determine whether the motor has a Hall fault.

TABLE 2

| Node | Warning | Level | Warning Code |
|---|---|---|---|
| Motor | Motor temperature has reached protection point | Halt | 0x08 |
| | Motor phase line fault | Halt | 0x09 |
| | Motor temperature has reached protection point | Halt | 0x10 |
| | Motor temperature sensor fault | Halt | 0x11 |

With continued reference to FIG. 2, the controller 400 further includes: a second memory 403, and the second memory 403 is connected to the second processor 402, so as to store identification information about the controller 400 and working state data of the controller 400. Exemplarily, the identification information about the controller 400 may be an assembly serial number of the controller 400, for uniquely identifying identity of the controller 400. The working state data of the controller 400 may include: at least one kind of working state data such as three-phase bridge arm driving signals (U, V, W), voltage signal, current signal, and temperature signal. When the working state data exceed a normal range, it may be determined that the controller 400 has a fault or is abnormal. As shown in following Table 3, the temperature signal in the working state data may be used to determine whether the temperature of the controller 400 has reached a protection point, temperature signal variation amplitude in the working state data may be used to determine a temperature sensor fault of the controller 400, the voltage signal in the working state data may be used to determine whether voltage in the controller 400 is over-voltage or under-voltage, so as to perform over-voltage protection or low-voltage protection, the current signal in the working state data may be used to determine whether current in the controller 400 is over-current, and current signal variation amplitude in the working state data may be used to determine a current sensor fault in the controller 400 (for example, when the controller 400 runs, an output current signal is too large).

TABLE 3

| Node | Warning | Level | Warning Code |
|---|---|---|---|
| Controller | Over-current | Halt | 0x27 |
| | Over-voltage | Halt | 0x07 |
| | Under-voltage | Halt | 0x06 |
| | Low-voltage protection | Halt | 0x31 |
| | Over-voltage protection | Halt | 0x32 |
| | Controller temperature has reached protection point | Halt | 0x14 |
| | Controller temperature sensor fault | Halt | 0x15 |
| | Current sensor fault | Halt | 0x12 |

Since the controller 400 is mounted on the bus 300 through the second processor 402, the controller 400 is also connected in communication with the Internet-of-things device 100 through the bus 300. The Internet-of-things device 100 acquires the identification information about the controller 400 and the working state data of the controller 400 through the bus 300, so as to perform the fault detection on the controller 400 according to the identification information about the controller 400 and the working state data of the controller 400.

To sum up, for another driving assembly management system provided in the present disclosure, by connecting the controller to the motor digital assembly in the multiple digital assemblies, the working state data of and identification information about the controller and the motor digital assembly are acquired using the Internet-of-things device, and further the fault detection may be performed on the controller and the motor digital assembly.

Figure 3:
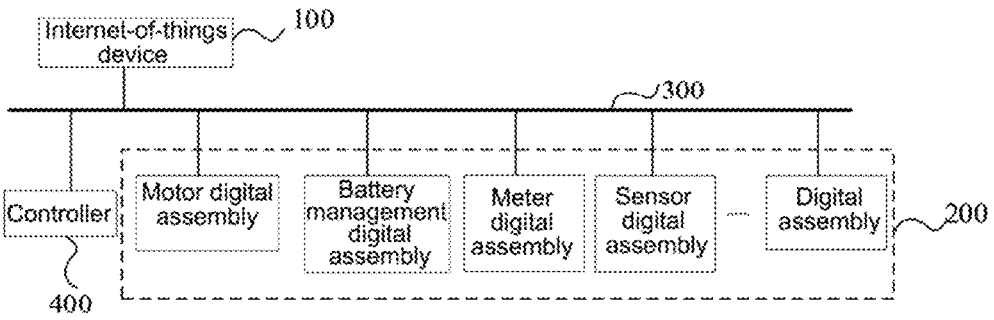
FIG. 3 is a structural schematic diagram of another driving assembly management system provided in embodiments of the present disclosure.

On the basis of FIG. 1, embodiments of the present disclosure further provide another driving assembly management system. FIG. 3 is a structural schematic diagram of another driving assembly management system provided in embodiments of the present disclosure. As shown in FIG. 3, the multiple digital assemblies 200 further include: at least one of a battery management digital assembly, a meter digital assembly, and a sensor digital assembly.

The battery management digital assembly includes: a battery and a power supply management system of the battery (BMS). In other examples, the battery management digital assembly further may be connected to a charger. The battery serves as an energy supply unit of the driving assembly management system. A battery management system is a protection plate of the battery and a communication management module, and the battery communicates with various functional units through the battery management system. Exemplarily, identification information about the battery management digital assembly may be an assembly serial number of the battery management digital assembly, for uniquely identifying identity of the battery management digital assembly. Working state data of the battery management digital assembly may include at least one kind of working state data such as current signal, voltage signal, and temperature signal. When parameters such as current value and/or temperature value exceed corresponding preset normal ranges, it may be determined that the battery management digital assembly has a fault. As shown in following Table 4, the temperature signal in the working state data may be used to determine whether a battery temperature is too high/too low, the voltage signal in the working state data may be used to determine whether total voltage is too high/too low, whether cell (individual) voltage is too high, and whether SOC is too high/too low, and the current signal in the working state data may be used to determine whether total current is too large.

The meter digital assembly is a human-machine interface for information display and setting. The user may check various kinds of information about the whole bicycle at meter end, and also may set functions displayed by a meter. The meter includes a display panel (human-machine interface) and keys. Exemplarily, identification information about the meter digital assembly may be an assembly serial number of the meter digital assembly, for uniquely identifying the meter digital assembly. As shown in the following Table 4, working state data of the meter digital assembly may be communication data, and when the communication data are abnormal, it may be determined that the meter digital assembly has a fault or is abnormal.

The sensor digital assembly, i.e. a digital sensor, is an action collection unit, which converts a person's riding action into a pulse signal and sends it to the controller through the bus. In the above, the sensor digital assembly includes: a cadence sensor digital assembly and a moment sensor digital assembly, which may convert a riders pedaling action into an electrical signal and send it to the controller through the bus, and play an important auxiliary role in the controller driving the motor to rotate, so that the rider can obtain more natural and smooth riding experience. Exemplarily, identification information about the sensor digital assembly may be an assembly serial number of the sensor digital assembly, for uniquely identifying identity of the sensor digital assembly. Working state data of the sensor digital assembly may be at least one kind of working state data such as cadence signal and moment signal, and when the working state data exceed a normal range, it may be determined that the sensor digital assembly has a fault or is abnormal. As shown in the following Table 4, the cadence signal in the working state data may be used to determine whether the sensor has a moment sensor cadence signal fault. The moment signal in the working state data may be used to determine whether the sensor has a moment sensor moment signal fault, and cadence signal variation amplitude and moment signal variation amplitude in the working state data may be used to determine whether there is a speed measurement sensor fault.

TABLE 4

| Node | Warning | Level | Warning Code |
|------|---------|-------|--------------|
| Sensor | Speed measurement sensor fault | Halt | 0x21 |
| | Moment sensor moment signal fault | Halt | 0x25 |
| | Moment sensor cadence signal fault | Halt | 0x26 |

TABLE 4-continued

| Node | Warning | Level | Warning Code |
|------|---------|-------|--------------|
| Battery | Total voltage too high (battery) | Halt | 0x41 |
| | Total voltage too low (battery) | Halt | 0x42 |
| | Total current too large (battery) | Halt | 0x43 |
| | Cell voltage too high (battery) | Halt | 0x44 |
| | Temperature too high (battery) | Halt | 0x45 |
| | Temperature too low (battery) | Halt | 0x46 |
| | SOC too high (battery) | Halt | 0x47 |
| | SOC too low (battery) | Halt | 0x48 |
| Meter | Communicationi fault | Halt | 0x30 |

To sum up, for another driving assembly management system provided in the present disclosure, by acquiring the working state data and identification information corresponding to the motor digital assembly, the battery management digital assembly, the meter digital assembly, the sensor digital assembly and the controller, the fault detection is precisely performed on the driving assemblies of the electric power-assisted bicycle.

Figure 4:
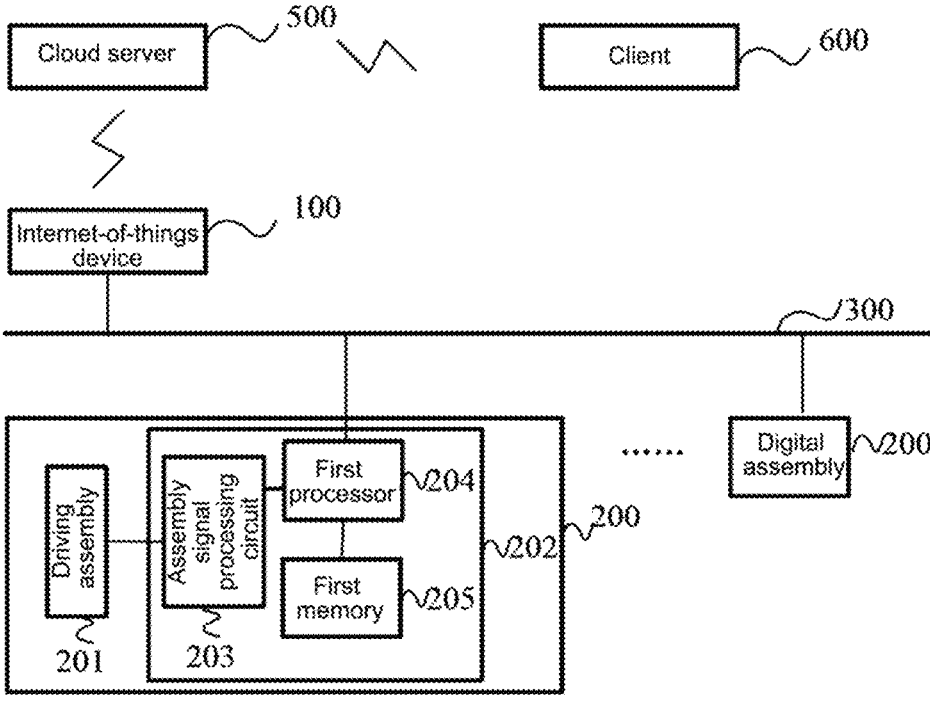
FIG. 4 is a structural schematic diagram of another driving assembly management system provided in embodiments of the present disclosure.

On the basis of FIG. 1, embodiments of the present disclosure further provide another driving assembly management system. FIG. 4 is a structural schematic diagram of another driving assembly management system provided in embodiments of the present disclosure. As shown in FIG. 4, the Internet-of-things device 100 is further connected in communication with a cloud server 500, so that the cloud server 500 performs the fault detection on the electric power-assisted bicycle based on the working state data of the multiple digital assemblies 200.

The cloud server 500 may store in advance information related to the digital assemblies 200 of the driving system of the electric power-assisted bicycle, such as identification information about various digital assemblies 200, driving assembly inventories from various locations and/or dealers, data parameters of normal working states corresponding to the digital assemblies 200, fault parameters and related provisions for maintenance and replacement.

The Internet-of-things device 100 transmits the working state data of and identification information about the digital assemblies 200 to the cloud server 500 through network communication. The cloud server 500 may classify and store the identification information about the digital assemblies 200, analyze the working state data of the digital assemblies 200, and determine a state (normal or faulty) of the driving assemblies 201 according to normal working state parameters and fault parameter analysis. When it is determined that a certain driving assembly 201 has a fault, identification information corresponding to this driving assembly 201 is acquired, and a demand order for replacement of the driving assembly 201 is generated according to the identification information corresponding to this driving assembly 201, wherein the demand order includes identification information about the faulty driving assembly 201, identification information about a new driving assembly 201 for replacement, possible place for replacement (e.g. maintenance site) and other information.

With continued reference to FIG. 4, the cloud server 500 is further connected in communication with a client 600. Users of the client 600 may be manufacturers of the driving assemblies 201, manufacturers of whole-bicycle, dealers, terminal users and so on, and different users have different permission settings. After the cloud server 500 determines that a certain driving assembly 201 has a fault and generates a demand order, the cloud server 500 may push the demand order to a corresponding client 600. In the above, the cloud server 500 may obtain MAC (Media Access Control) address of the Internet-of-things device 100, and then further obtain a corresponding client 600 through a preset correspondence relationship between the MAC address of the Internet-of-things device 100 and the client 600.

To sum up, for another driving assembly management system provided in the present disclosure, by transmitting the working state data and identification information corresponding to the digital assemblies to the cloud server, the cloud server performs the fault detection on the electric power-assisted bicycle based on the working state data of the multiple digital assemblies. Thus, the faulty driving assembly may be accurately learnt, and the corresponding demand order is timely sent to the user.

On the basis of FIG. 1, embodiments of the present disclosure further provide another driving assembly management system. FIG. 5 is a schematic diagram of connection of another driving assembly management system provided in embodiments of the present disclosure. As shown in FIG. 5, the driving assembly management system further includes: a fault detection apparatus 700.

The fault detection apparatus 700 is mounted on the bus 300, so as to perform fault detection on the electric power-assisted bicycle based on the working state data of the multiple digital assemblies 200. As the cloud server 500 analyzes the working state data after acquiring the working state data of and identification information about the digital assembly 200, then determines the faulty driving assembly 201, and the driving assembly management system of the electric power-assisted bicycle is not connected to the cloud server 500 in real time, fault detection delay may be caused. Further, by transmitting the working state data of the multiple digital assemblies 200 and the identification information about the multiple digital assemblies 200 to the fault detection apparatus 700 through the Internet-of-things device 100, detection on the digital assemblies 200 may be completed by the fault detection apparatus 700, and a detection result is transmitted to the cloud server 500 through the Internet-of-things device 100.

In another example, the fault detection apparatus 700 may be integrated in the Internet-of-things device 100, the detection on the digital assemblies 200 is completed by the fault detection apparatus 700 in the Internet-of-things device 100, and the Internet-of-things device 100 transmits a detection result to the cloud server 500.

To sum up, for another driving assembly management system provided in the present disclosure, the detection on the digital assemblies is completed by the fault detection apparatus, and then the detection result is transmitted to the cloud server. Thus, when the driving assembly management system of the electric power-assisted bicycle is not connected to the cloud server, localized fault detection is implemented, and then the fault result is uploaded to a service end, thus reducing sending of communication data and dependence on the communication network.

Embodiments of the present disclosure further may provide a fault detection method for a driving assembly based on the above driving assembly management system. A specific implementation process of the fault detection method for an electric power-assisted bicycle is illustrated below with reference to the drawings. FIG. 6 is a schematic flowchart of a fault detection method for a driving assembly provided in embodiments of the present disclosure. As shown in FIG. 6, the method includes:

S101. Acquiring, by an Internet-of-things device, working state data of multiple digital assemblies and identification information about the multiple digital assemblies.

The digital assemblies, upon receipt of a data collection message sent by the Internet-of-things device, transmit their own working state data and identification information to the Internet-of-things device through a bus. After acquiring the working state data of the multiple digital assemblies and the identification information about the multiple digital assemblies, the Internet-of-things device transmits the working state data of the multiple digital assemblies and the identification information about the multiple digital assemblies to a cloud server.

S102. Performing fault detection according to the working state data of the multiple digital assemblies and the identification information about the multiple digital assemblies.

Real-time working state data of the digital assemblies and normal working state data ranges of the digital assemblies are compared. If the real-time working state data of a digital assembly is not within the normal working state data range, it is determined that this digital assembly has a fault or is abnormal. Model of this digital assembly may be determined through the identification information about the digital assembly, and thus the model of the faulty driving assembly may be determined, so as to facilitate replacement of the faulty driving assembly.

To sum up, for the fault detection method for a driving assembly provided in the present disclosure, the fault detection is performed according to the working state data of the multiple digital assemblies and the identification information about the multiple digital assemblies acquired by the Internet-of-things device. Thus, when detection and maintenance are performed on the driving assemblies, neither disassembly nor manual determination is needed, and automatic fault detection may be performed based on the working state data and the identification information, which effectively facilitates the maintenance of the driving system of the electric power-assisted bicycle, and provides more convenient post-sales services for users.

Based on the above fault detection method for a driving assembly shown in FIG. 6, embodiments of the present disclosure further provide a fault detection method for a driving assembly. After performing the fault detection according to the working state data of the multiple digital assemblies and the identification information about the multiple digital assemblies in S102, the method includes:

generating, if a fault detection result indicates that at least one digital assembly among the multiple digital assemblies has a fault, demand order information for replacing the at least one digital assembly according to identification information about the at least one digital assembly that has a fault.

In the above, the demand order information includes the identification information about the faulty driving assembly, identification information about a new driving assembly for replacement, possible place for replacement (e.g. maintenance site) and other information. After it is determined that a certain digital assembly has a fault and a demand order is generated, the demand order may be pushed to a corresponding client.

To sum up, for the fault detection method for a driving assembly provided in the present disclosure, by generating, according to the identification information about the digital assembly having a fault, the demand order information for replacing this digital assembly, the user may more conveniently learn the driving assembly fault and replacement information, thereby providing more convenient post-sales services for the user.

Based on the above fault detection method for a driving assembly shown in FIG. 6, embodiments of the present disclosure further provide a specific implementation method for fault detection in the above fault detection method for a driving assembly.

In an embodiment, the Internet-of-things device transmits the working state data of the multiple digital assemblies and the identification information about the multiple digital assemblies to a cloud server. The cloud server compares real-time working state data of the digital assemblies and normal working state data ranges of the digital assemblies, and if the real-time working state data of a digital assembly is not within a normal working state data range, it is determined that this digital assembly has a fault.

In another embodiment, the Internet-of-things device may directly perform the fault detection according to the working state data of the multiple digital assemblies and the identification information about the multiple digital assemblies. Specifically, the Internet-of-things device is integrated therein with a fault detection module, wherein the fault detection module, when acquiring real-time working state data of the multiple digital assemblies and the identification information about the multiple digital assemblies, compares the real-time working state data of the multiple digital assemblies with the normal working state data ranges of the multiple digital assemblies, and if real-time working state data of a digital assembly is not within a normal working state data range, it is determined that this digital assembly has a fault. The Internet-of-things device transmits a detection result to the cloud server.

In another embodiment, the working state data of the multiple digital assemblies and the identification information about the multiple digital assemblies are transmitted through the Internet-of-things device to the fault detection apparatus connected to the Internet-of-things device through the bus. The fault detection apparatus compares real-time working state data of the multiple digital assemblies and normal working state data ranges of the corresponding digital assemblies, if the real-time working state data of a digital assembly is not within a normal working state data range, it is determined that this digital assembly has a fault, and a detection result is transmitted to the cloud server through the Internet-of-things device.

To sum up, for the specific implementation method of fault detection in the above fault detection method for a driving assembly provided by the present disclosure, the fault detection is performed by the cloud server, the Internet-of-things device, and the fault detection apparatus, respectively, Thus, through combination of an on-line server and localization, the fault detection on the digital assemblies may be completed for all time, thereby reducing sending of communication data and dependence on the communication network.

Embodiments of the present disclosure further may provide an electric power-assisted bicycle based on the above driving assembly management system. FIG. 7 is a structural schematic diagram of an electric power-assisted bicycle provided in embodiments of the present disclosure. As shown in FIG. 7, the electric power-assisted bicycle 800 includes: an electric power-assisted bicycle frame 802 and the above driving assembly management system 801 mounted on the electric power-assisted bicycle frame 802.

To sum up, for the electric power-assisted bicycle provided in the present disclosure, by the driving assembly management system mounted on the electric power-assisted bicycle frame, when detection and maintenance are performed on the driving assemblies, neither disassembly nor manual determination is needed, and automatic fault detection may be performed based on the working state data and the identification information, which effectively facilitates the maintenance of the driving system of the electric power-assisted bicycle, and provides more convenient post-sales services for users.

It should be understood that in the several embodiments provided in the present disclosure, the apparatus and the method disclosed may be implemented in other manners. For example, the apparatus embodiment described in the above is merely exemplary, for example, the units are merely divided according to logical functions, but they may be divided in other manners in practical implementation, for example, multiple units or assemblies may be combined or may be integrated into another system, or some features may be omitted, or not executed. In addition, mutual couplings or direct couplings or connections in communication as shown or discussed may be indirect couplings or connections in communication through some interfaces, means or units, and may be in an electrical form, a mechanical form or other forms.

The units described as separate components may or may not be physically separated, and components displayed as units may or may not be physical units, that is, they may be located at one place, or also may be distributed on a plurality of network units. The objective of the solution of the present embodiment may be realized by selecting part or all of the units thereof as actually required.

In addition, various functional units in respective embodiments of the present disclosure may be integrated in one processing unit, various units also may independently and physically exist, and two or more units also may be integrated in one unit. The above integrated unit may be implemented in the form of hardware, or in the form of hardware plus a software functional unit.

The above integrated unit implemented in the form of software functional unit may be stored in one computer-readable storage medium. The above software functional unit is stored in one storage medium, including several instructions used to make one computer device (which may be a personal computer, a sever or a network device etc.) or a processor execute some of the steps of the methods of various embodiments of the present disclosure. The preceding storage medium includes various media in which program codes can be stored, such as USB flash disk, mobile hard disk, Read-Only Memory (ROM for short), Random Access Memory (RAM for short), diskette and compact disk.

The above-mentioned are merely for specific embodiments of the present disclosure, but the scope of protection of the present disclosure is not limited thereto, and any change or substitution that may easily occur to those skilled in the present art within the technical scope disclosed in the present disclosure should be covered within the scope of protection of the present disclosure. Therefore, the scope of protection of the present disclosure should be determined by the scope of protection of the claims.

What is claimed is:

1. A driving assembly management system, comprising: an Internet-of-things device, multiple digital assemblies and a bus; each digital assembly comprises: one driving assembly in a driving system of an electric power-assisted bicycle, and a digital circuit connected to the driving assembly, wherein the digital circuit comprises: an assembly signal processing circuit, a first processor and a first memory, wherein an input end of the assembly signal processing circuit is connected to a signal collection end of the driving assembly, so as to process a driving signal of the driving assembly during working, and obtain working state data of the digital assembly; the first processor is further connected to the assembly signal processing circuit, so as to acquire the working state data of the digital assembly; and the first memory is connected to the first processor, so as to store the working state data and identification information about the digital assembly; and the Internet-of-things device is connected in communication with the first processors in the multiple digital assemblies through the bus, so as to perform fault detection according to the working state data of the multiple digital assemblies and the identification information about the multiple digital assemblies.

2. The driving assembly management system according to claim 1, wherein the multiple digital assemblies comprise: a motor digital assembly, and a driving assembly in the motor digital assembly is a motor; and wherein the driving assembly management system further comprises: a controller, wherein the controller comprises: a motor driving circuit and a second processor; and the second processor is mounted on the bus, so that the second processor acquires the working state data of the multiple digital assemblies;

the second processor is further connected to the motor driving circuit, so that the second processor outputs a pulse control signal to the motor driving circuit based on the working state data of the multiple digital assemblies; and the motor driving circuit is connected to a three-phase input end of the motor, so that a three-phase control signal output by the motor driving circuit drives the motor to output power assistance.

3. The driving assembly management system according to claim 2, wherein the controller further comprises: a second memory, wherein the second memory is connected to the second processor, so as to store identification information about the controller, and working state data of the controller.

4. The driving assembly management system according to claim 1, wherein the Internet-of-things device is connected in communication with a cloud server, so that the cloud server performs fault detection on the electric power-assisted bicycle based on the working state data of the multiple digital assemblies.

5. The driving assembly management system according to claim 1, wherein the driving assembly management system further comprises: a fault detection apparatus, wherein the fault detection apparatus is mounted on the bus, so as to perform fault detection on the electric power-assisted bicycle based on the working state data of the multiple digital assemblies.

6. The driving assembly management system according to claim 2, wherein the multiple digital assemblies further comprise: at least one digital assembly of a battery management digital assembly, a meter digital assembly, and a sensor digital assembly.

7. A fault detection method for a driving assembly, applied to the driving assembly management system according to claim 1, wherein the method comprises steps of:

acquiring, by the Internet-of-things device, working state data of the multiple digital assemblies and identification information about the multiple digital assemblies; and performing fault detection according to the working state data of the multiple digital assemblies and the identification information about the multiple digital assemblies.

8. The method according to claim 7, wherein the step of performing fault detection according to the working state data of the multiple digital assemblies and the identification information about the multiple digital assemblies comprises:

transmitting, through the Internet-of-things device, the working state data of the multiple digital assemblies and the identification information about the multiple digital assemblies to a cloud server, so that the cloud server performs fault detection according to the working state data of the multiple digital assemblies and the identification information about the multiple digital assemblies; or performing, by the Internet-of-things device, fault detection according to the working state data of the multiple digital assemblies and the identification information about the multiple digital assemblies; or transmitting, through the Internet-of-things device, the working state data of the multiple digital assemblies and the identification information about the multiple digital assemblies, to a fault detection apparatus connected to the Internet-of-things device through the bus, and performing, by the fault detection apparatus, fault detection according to the working state data of the multiple digital assemblies and the identification information about the multiple digital assemblies.

9. The method according to claim 7, further comprising a step of:

generating, if a fault detection result indicates that at least one digital assembly among the multiple digital assemblies has a fault, demand order information for replacing the at least one digital assembly, according to identification information about the at least one digital assembly that has a fault.

10. An electric power-assisted bicycle, comprising: an electric power-assisted bicycle frame; and the driving assembly management system according to claim 1 mounted on the electric power-assisted bicycle frame.

11. The fault detection method for a driving assembly according to claim 7, wherein the multiple digital assemblies comprise: a motor digital assembly, and a driving assembly in the motor digital assembly is a motor; and wherein the driving assembly management system further comprises: a controller, wherein the controller comprises: a motor driving circuit and a second processor; and the second processor is mounted on the bus, so that the second processor acquires the working state data of the multiple digital assemblies;

the second processor is further connected to the motor driving circuit, so that the second processor outputs a pulse control signal to the motor driving circuit based on the working state data of the multiple digital assemblies; and the motor driving circuit is connected to a three-phase input end of the motor, so that a three-phase control signal output by the motor driving circuit drives the motor to output power assistance.

12. The fault detection method for a driving assembly according to claim 11, wherein the controller further comprises: a second memory, wherein the second memory is connected to the second processor, so as to store identification information about the controller, and working state data of the controller.

13. The fault detection method for a driving assembly according to claim 7, wherein the Internet-of-things device is connected in communication with a cloud server, so that the cloud server performs fault detection on the electric power-assisted bicycle based on the working state data of the multiple digital assemblies.

14. The fault detection method for a driving assembly according to claim 7, wherein the driving assembly management system further comprises: a fault detection apparatus, wherein the fault detection apparatus is mounted on the bus, so as to perform fault detection on the electric power-assisted bicycle based on the working state data of the multiple digital assemblies.

15. The fault detection method for a driving assembly according to claim 11, wherein the multiple digital assemblies further comprise: at least one digital assembly of a battery management digital assembly, a meter digital assembly, and a sensor digital assembly.

16. The electric power-assisted bicycle according to claim 10, wherein the multiple digital assemblies comprise: a motor digital assembly, and a driving assembly in the motor digital assembly is a motor; and wherein the driving assembly management system further comprises: a controller, wherein the controller comprises: a motor driving circuit and a second processor; and the second processor is mounted on the bus, so that the second processor acquires the working state data of the multiple digital assemblies;

the second processor is further connected to the motor driving circuit, so that the second processor outputs a pulse control signal to the motor driving circuit based on the working state data of the multiple digital assemblies; and the motor driving circuit is connected to a three-phase input end of the motor, so that a three-phase control signal output by the motor driving circuit drives the motor to output power assistance.

17. The electric power-assisted bicycle according to claim 16, wherein the controller further comprises: a second memory, wherein the second memory is connected to the second processor, so as to store identification information about the controller, and working state data of the controller.

18. The electric power-assisted bicycle according to claim 10, wherein the Internet-of-things device is connected in communication with a cloud server, so that the cloud server performs fault detection on the electric power-assisted bicycle based on the working state data of the multiple digital assemblies.

19. The electric power-assisted bicycle according to claim 10, wherein the driving assembly management system further comprises: a fault detection apparatus, wherein the fault detection apparatus is mounted on the bus, so as to perform fault detection on the electric power-assisted bicycle based on the working state data of the multiple digital assemblies.

20. The electric power-assisted bicycle according to claim 16, wherein the multiple digital assemblies further comprise: at least one digital assembly of a battery management digital assembly, a meter digital assembly, and a sensor digital assembly.

* * * * *